United States Patent
Whittaker

[11] Patent Number: 5,666,513
[45] Date of Patent: Sep. 9, 1997

[54] AUTOMATIC RECONFIGURATION OF MULTIPLE-WAY CACHE SYSTEM ALLOWING UNINTERRUPTED CONTINUING PROCESSOR OPERATION

[75] Inventor: Bruce Ernest Whittaker, Mission Viejo, Calif.

[73] Assignee: Unisys Corporation, Blue Bell, Pa.

[21] Appl. No.: 583,327

[22] Filed: Jan. 5, 1996

[51] Int. Cl.[6] .................. G06F 12/08; G06F 13/00
[52] U.S. Cl. ............... 711/118; 364/DIG. 1; 364/243.4; 364/243.41; 711/3; 711/129; 711/141
[58] Field of Search ............ 364/243.4, 243.41, 364/DIG. 1, DIG. 2; 395/445, 456, 468, 403

[56] References Cited

U.S. PATENT DOCUMENTS

| | | | |
|---|---|---|---|
| 5,325,504 | 6/1994 | Tipley et al. | 395/455 |
| 5,345,582 | 9/1994 | Tsuchiya | 395/575 |
| 5,367,653 | 11/1994 | Coyle et al. | 395/400 |
| 5,410,669 | 4/1995 | Biggs et al. | 395/445 |
| 5,446,863 | 8/1995 | Stevens et al. | 395/427 |
| 5,500,814 | 3/1996 | Kinoshita et al. | 365/49 |
| 5,522,056 | 5/1996 | Watanabe et al. | 395/455 |
| 5,537,609 | 7/1996 | Whittaker et al. | 398/800 |

*Primary Examiner*—Tod R. Swann
*Assistant Examiner*—Tuan V. Thai
*Attorney, Agent, or Firm*—Alfred W. Kozak; Mark T. Starr; Steven R. Petersen

[57] ABSTRACT

A multi-set cache module is initiated by a maintenance subsystem to function with all sets on-line or only some sets on-line. A parity error sensing switch flip-flop unit will selectively disable only those sets which indicate parity error problems except when multiple simultaneous "hit" signals occur, in which case, the switch unit disables all of the cache sets.

3 Claims, 6 Drawing Sheets

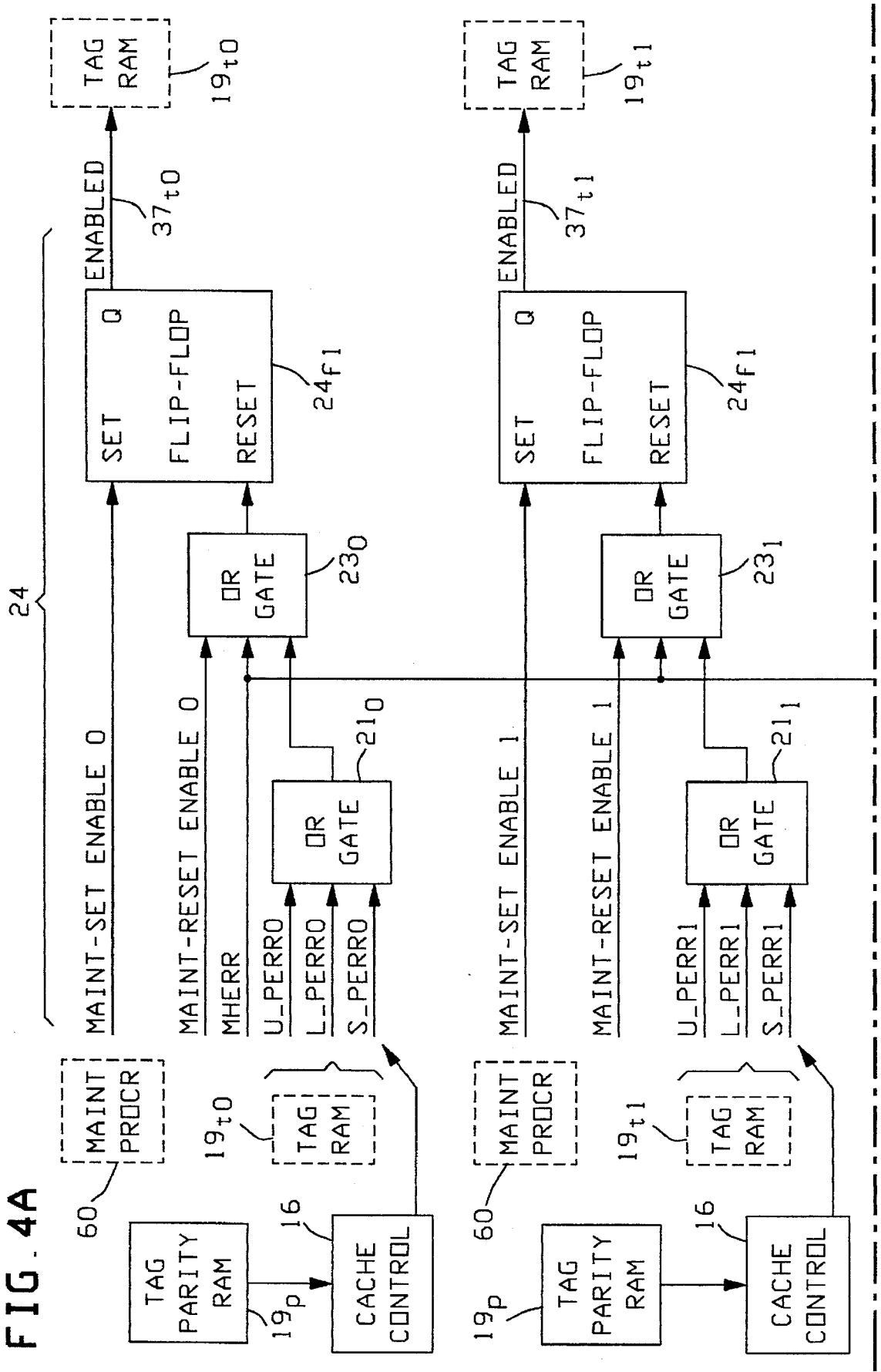

1

AUTOMATIC RECONFIGURATION OF MULTIPLE-WAY CACHE SYSTEM ALLOWING UNINTERRUPTED CONTINUING PROCESSOR OPERATION

FIELD OF THE INVENTION

The present disclosure involves multi-way cache memory systems for computer processors having enabling logic for adjusting operations for normal or for degraded state conditions.

BACKGROUND OF THE INVENTION

A generalized view of a computer system network is shown in FIG. 5 where a processor 14 has an internal processor bus 14b which communicates with a cache memory 19. Further, the processor 14 and cache memory 19 can communicate through an interface 20 to a system main memory 40 by means of a system bus which may be a dual system bus having two a busses 22a and 22b. Whenever the processor 14 needs data from memory, the cache memory 19 is the first line of resource for this data. An efficient cache design will, on average, contain the desired information for the processor about 90% of the time. If the cache memory 19 does not have the required information in its latest most valid state, then the data must be accessed from the system main memory 40 over a system bus mechanism such as the dual system busses 22. This latter cycle of retrieval from main memory of course, is much slower in time than the preferred case of retrieval from the cache memory 19 when there is a "cache hit" occurring.

FIG. 6 is a more detailed view of the cache memory design which indicates the elements of the cache memory module 19. Shown therein is the processor bus 14b which involves two busses. These include an address bus 14ba and a data bus 14bd. The cache module 19 is indicated as having three major units which include the Tag RAM unit 19t, a Data RAM unit 19d and a cache control module 16. The Tag RAM unit 19t holds the addresses of the data which is contained within the Data RAM 19d at any particular moment. The Tag RAM 19t provides the means by which there can occur a comparison of the processor requested address values with the address values held in the Tag RAM 19t. When a match occurs, this is called a "cache hit" and it indicates that the cache unit does indeed contain valid data for the requested address from the processor 14.

The Data RAM unit 19d in FIG. 6 is the storage area for all of the data that is held within the cache module 19 at any given moment. The Data RAM is generally a very expensive, very fast RAM device that can return data to the processor 14 during "cache hit" conditions. The Cache Control Unit 16 monitors the Tag RAM "hit" condition and also controls the reading out of the Data Ram 19d. When there is a Tag "miss" condition (not a hit), then the Cache Control Unit 16 controls the writing of data into the Data RAM 19d which data has been subsequently retrieved from the main memory 40. The activity for retrieving data, after a miss, from main memory 40 and writing this into the cache 19 is called "filling" (loading) the cache.

In order to gain higher cache "hit" rates, that is to say, 90% and above, it has been found that a special structuring of the cache data into several groups or banks of data is a very effective arrangement. These groups or banks of data are often referred to as "sets" or as "ways".

FIG. 2 is a drawing which illustrates the Tag units and Data RAM units as separate sets or ways and illustrates this as a four-set type of cache structure. Here the Data RAM 19d is constituted of four separate data groups or sets, 19d0, 19d1, 19d2, and 19d3. For a 64K word cache, the data will then be grouped into four cache sets each of which holds 16k words. However, only one of the four cache sets will contain the data for any given address in the Tag RAM 19t, at any given time. Thus for a cache "hit", only one of the four sets of the Data RAM 19d will be enabled to drive data onto the bus 14bd, FIG. 2, back to the processor 14.

Each of the cache sets has its own individual Tag RAM unit 19t. In FIG. 2, there are four Tag RAMs shown as 19t0, 19t1, 19t2, and 19t3. Each of these four Tag RAMs will hold 4K addresses. Each Tag RAM set is a 4K Tag RAM since each of the 4,000 addresses it contains actually points at a four-word block unit (w1, w2, w3, w4) within the Data RAM 19d. With the multiple sets (four sets illustrated here), there is only one set that is allowed to contain a given address value and to therefore produce a "hit" condition at any given time. The Tag set that produces the "hit" will select its associated Data RAM 19d in order to drive data to the processor 14, on bus 14bd Since the cache memory 19 is structured into various identical portions called sets or ways, it is seen that the cache memory may be capable of operation under various combinations of usage of these sets or ways where some sets may be operative and some sets may be inoperative at any given time. It is this configuration of the combination of the cache sets that is the general focus of the system described in this disclosure.

It is an object of the present system to provide for control as to which configurations of data sets are to be used at any given time. It is also an object to provide for the automatic adjustment of the configuration of the cache sets under certain error conditions and also to provide for the continuing operation of the cache memory even when certain error-type transitions in the configuration may occur so that the cache memory can continue to operate in a degraded configuration without interruption to the processor.

Theory and experience indicates that the "larger" is the cache unit, the greater is its storage capacity and therefore the greater is its potential to assist the processor in providing immediate "hit" data. Thus, for a multiple set cache, such as the four-set cache used and shown herein, the maximum configuration whereby all cache sets are in "on-line" operation, provides the maximum performance. However, even though there are multiple cache sets, it is necessary to account for the possibility that less than the maximum number of sets in the configuration will be useable, such as for example, only three sets of the four being available at some given moment. These "less than maximum" type configurations might occur for several reasons which include (a) the intentional reduced configuration to provide a lower performance system for shipment; (b) the unintentional reduced configuration due to the occurrence of some error condition in one or more of the cache sets.

The presently described system will be seen to enable operator control and maintenance subsystem control of the cache-set configurations in addition to enabling operations of the system under an automatic adjustment arrangement even when certain error conditions reduce the usability of certain ones of the cache sets.

SUMMARY OF THE INVENTION

A multi-set cache module using N cache sets in a computer system is initiated from a Maintenance Subsystem to select which ones of the "N" multi-set caches will be on-line and which will be off-line. The control of use of each cache set is handled through a set of Switching Flip Flop units which are sensitive to three types of parity errors in each Tag RAM of the cache module. Upon detecting a parity error in either an Upper Byte, or Lower Byte or a status bit of any address data in a particular set of Tag RAMs, the Switching Flip Flop unit will "disable" only the specific cache set that generated the error while permitting all other cache sets to continue operations. Thus, the system can still function in a degraded cache condition. In the case where the cache module indicates "multiple hits" on the same request-access cycle, the Switching Flip-Flop unit will "disable" all of the "N" cache sets but still allow processor operations to execute with integrity by accessing main memory instead of cache.

DESCRIPTION OF THE PREFERRED EMBODIMENT

Figure 2:
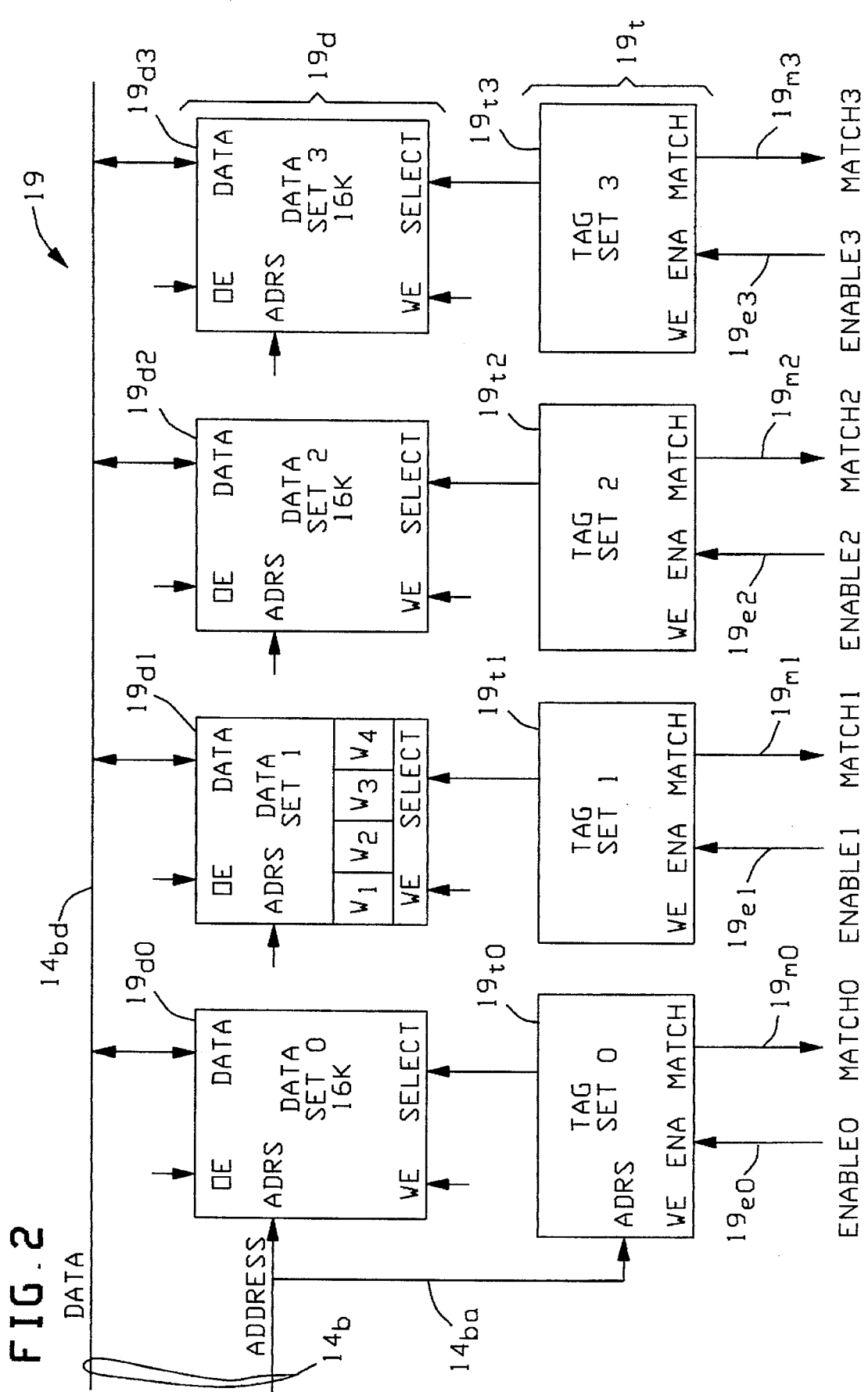
FIG. 2 is a drawing of a multiple-set cache module for servicing the Central Processor.

Referring to FIG. 2, there is seen the multiple set cache module 19. Each individual set of the four sets has both a Data RAM facility 19d and a Tag RAM facility 19t. The Tag RAM 19t holds the address information regarding which address groups of data are currently held within that particular set of the Data RAMs 19d. The Tag RAM 19d in each case, provides a "match" indication as to the state of the current address value on the address bus 14ba. As seen in FIG. 2, each Tag set 0, 1, 2, 3, has an output match signal line respectively designated 19m0, 19m1, 19m2, and 19m3. The "match" signal indicates that the Tag RAM in each case has done a comparison of the incoming address value on the address bus 14ba, with the address value stored within the Tag RAM at that location. The "match" signal indicates that the stored value is a valid address and that it does indeed match the incoming address. From this FIG. 2, it is seen that there are actually four "match" indicator signals, one from each of the four sets. These are used by the cache control logic 16 (FIG. 3) to create an overall cache "hit" condition.

Operationally, there can be several states of operation for the cache memory 19. Since there are multiple cache sets, certain configurations can occur where all of the cache sets are "on-line" and "working", while there can be other configurations where there is a degradation of operation where only some, but not all, of the cache sets are operable. Since there is the possibility of various configurations being utilized among the cache sets, there is provided a means for "disabling" a given "match" signal (19 mn in FIG.3) from any given set. Also shown in FIG. 2 are the individual "enable" signals to each of the four sets. These enable input signals are shown respectively as 19e0, 19e1, 19e2 and 19e3. These signals, when active (enable="on") allow the cache Tag RAM units 19t to do the necessary address comparison functions and then to drive out the respective "match" signal address to the Data RAM 19d. However, when the "enable" signals are inactive (enable="off"), then the respective match signals are "tri-stated" out of existence for that respective Tag RAM facility 19t.

Figure 1:
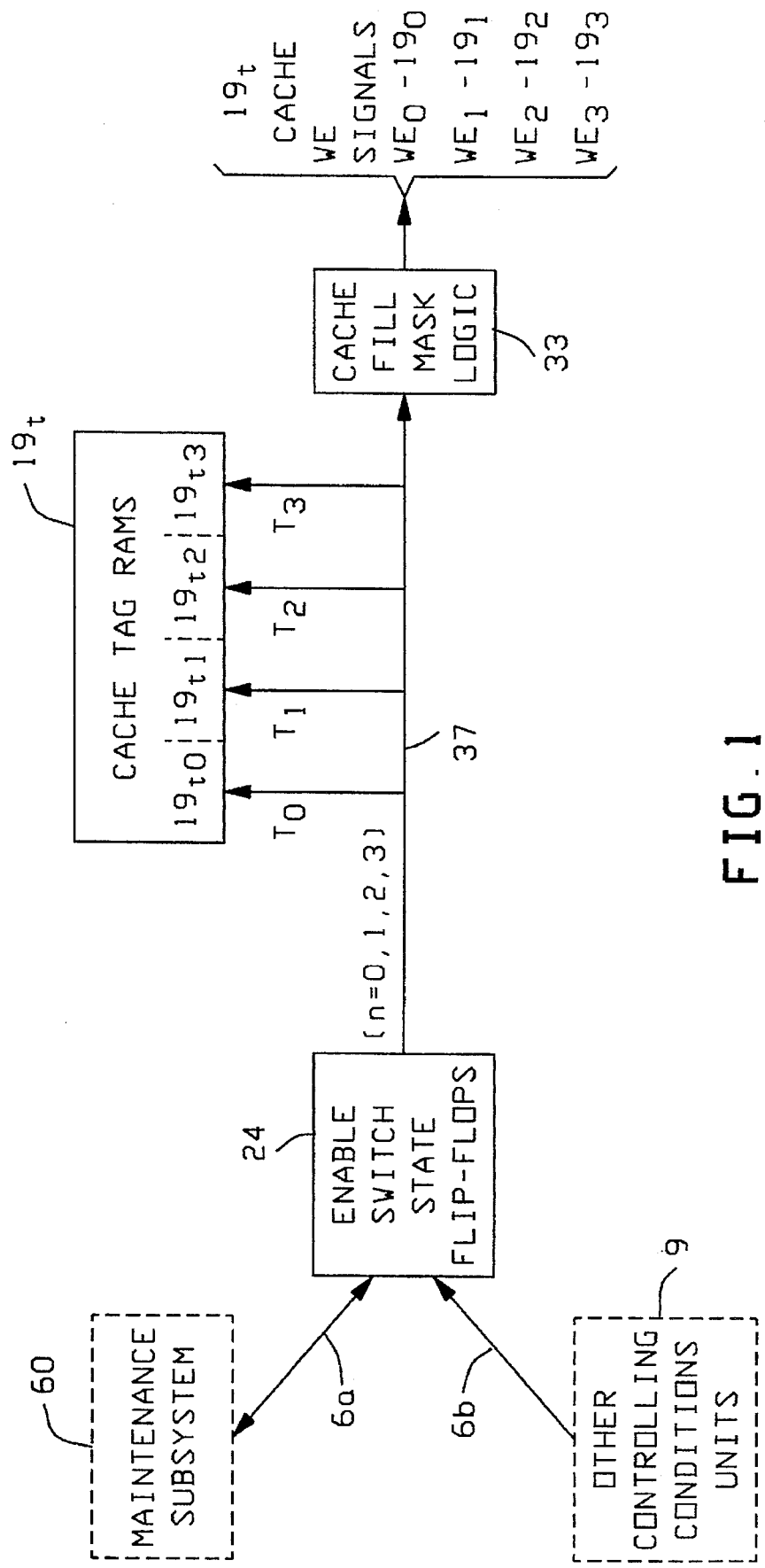
FIG. 1 is a drawing of a multi-set cache module which can be controlled for full set operation or degraded operation.

The four "enable" signals 19en to the Tag RAMs 19t are four switch-type signals set via the enable flip-flop switch state unit 24 of FIG. 1, which signals are "set" by the Maintenance Subsystem 60. The Maintenance Subsystem 60 will set up the cache configuration through the four enable switch units 24 at system initialization time. If, for example, the system in FIG. 1 is to be operated as a maximum configuration, then all four of the "enable" switches in 24 will be set to the active state, thus allowing all four of the cache sets to operate on-line. However, if, at initialization time, some reduced configuration of fewer sets is desired (degraded condition), then the switches 24 of FIG. 1 and FIG. 4 will be set to enable only that group of sets necessary to provide the reduced configuration. Again, further, if for some reason, (usually only during system diagnostics), it is desired to "turn-off" the cache operation completely, then the "enable" switches 24 would all be turned to the "off state thus disabling all four of the cache sets and taking them "off-line".

Referring to FIG. 1, there is seen the control configuration for the conditions under which the system will operate. In FIG. 1, the four enable switches 24 operate as four flip flops (FIG. 4) that can be controlled (set to any state) from two different sources as (i) 60 for the Maintenance Subsystem source or (ii) other controlling unit sources designated 9 in FIG. 1. The first source, via line 6a, is from the Maintenance Subsystem 60. This source always sets up the initial running state of the enable switches 24 and thus controls the cache configuration itself. When any planned or intentional reduced configuration is desired, the Maintenance Subsystem source 60 will control the state of each of the four enable switches 24, flip-flops 24f0, 24f1, 24f2, 24f3 of FIG. 4.

The second source from units 9 on line 6b, designates that there are several other controlling conditional units which may be used during the operation of the cache system 19. The controlling condition units 9 will be discussed hereinafter. In either case, the source always modifies the initial state that was set into the enable switches 24 at system initialization time.

The source operation may take a single cache set off-line by disabling it, or it may take several sets, in any combination, off-line, or it may disable the entire cache memory 19. The taking of sets off-line will occur automatically in response to several conditions. However, this will occur in such a way as to be "invisible" to the processor 14 using the cache 19. Thus, the cache will continue to operate undisturbed even when it operates in the degraded state condition.

Further, in FIG. 1, there is seen the destination points for each of the four enable switches in unit 24. These destination lines designated t0, t1, t2, and t3 will connect to two different blocks within the cache structure. First, they go to each one of the sets of Tag RAMs 19t. Secondly, they are connected to the unit designated as the Cache Fill Mask Logic 33. The Cache Fill Mask Logic controls which particular cache set will be used on the "next cache fill" data operation which is to be written into the cache. In both of these cases, it is vital that, in order to allow degraded operation of a multi-way cache, that the enable switch state from 24 be available to these cache sets and the Cache Fill Mask Logic and that the switch state flip-flops in 24 be held in the currently desired condition. For proper degraded operations, both the Tag RAMs 19t and the Fill Mask Logic 33 must have the enable switch state 24 automatically adjusted to the current proper state condition. This is accomplished by the present system.

Enable Switch State

In FIG. 1, the Maintenance Subsystem 60 has a controlling path 6a to the enable switches 24 which is actually bi-directional. That is to say, not only can the Maintenance Subsystem change the state condition of the enable switch flip-flops 24, but in addition, it can also read the current state of the flip-flops in the switch module 24. This is a very useful additional feature.

The ability of the Maintenance Subsystem 60 to "read" the switch states in unit 24, is importantly useful in doing diagnostics of the connection path 6a and also the conditions of the switch flip-flops in unit 24. The diagnostic software can set any set of states into the flip-flops 24 and then read back the states in order to verify the paths to and from the flip-flops and also the condition of the switch flip-flops themselves to verify their correct operation.

The major importance of the "readability" of the switch flip-flop states as information back to the Maintenance Subsystem 60 is for the evaluation value of the cache degradation under various error conditions. Since the enable switch flip-flops 24 will automatically adjust under certain error conditions as indicated later hereon, then at any point in time, the flip-flop states will reflect the state of the operating cache memory 19. Thus, the switch states will tell the diagnostic software in Maintenance Subsystem 60, exactly which ones of the four cache sets are "on-line" and which ones are off-line. This information, along with the information regarding the occurrence of cache errors, will allow a quick analysis of the cache errors and a plan to remedy the conditions that exist.

Cache Error Conditions

Figure 3:
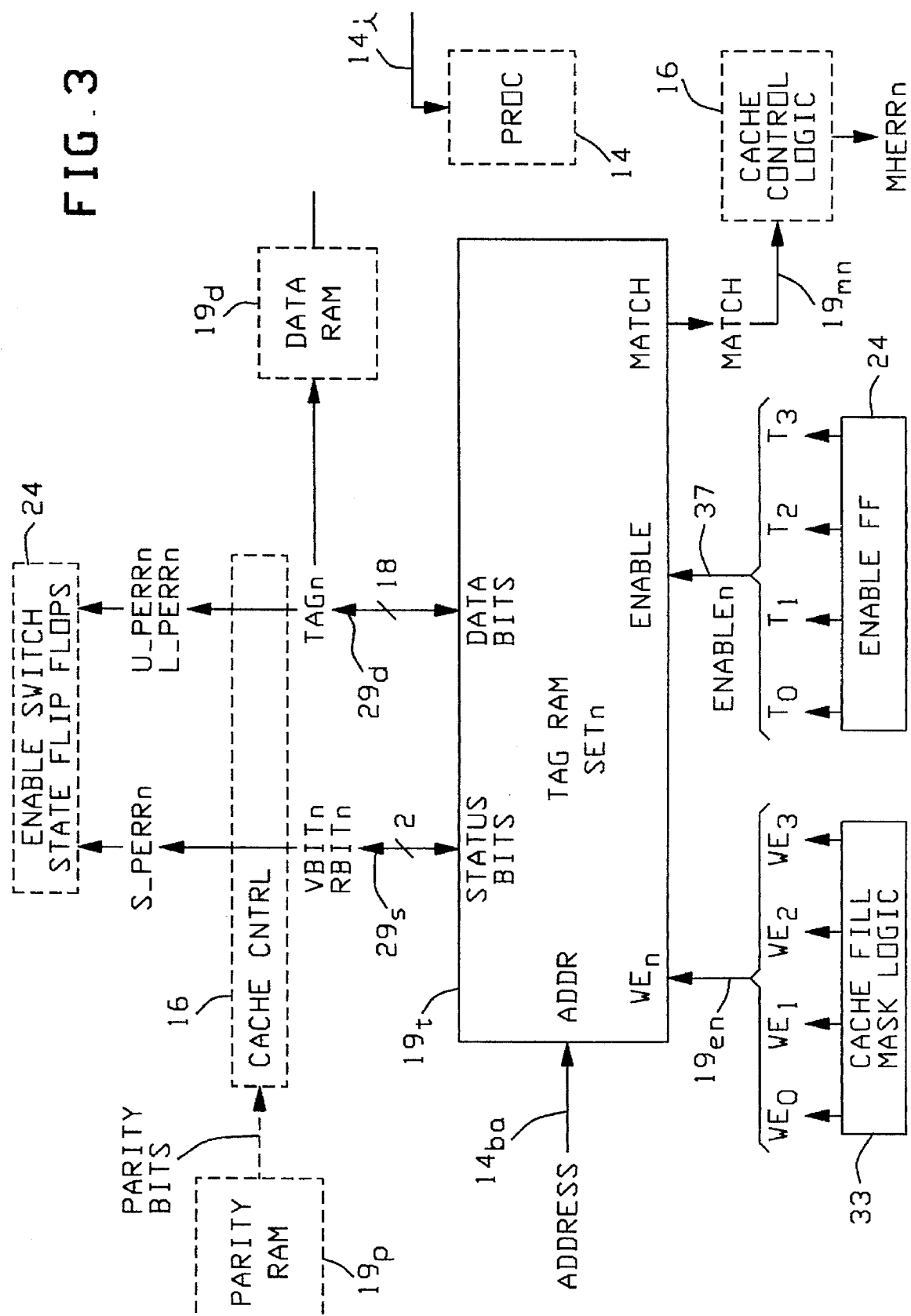
FIG. 3 is a drawing of a typical one of the set of Tag RAMs showing the input and output signals and the status bit signals involved.

FIG. 3 is a generalized drawing indicating the signal lines for each individual set of Tag RAMs 19t. The individual Tag RAM is designated as SETn, where n represents set 0, 1, 2, 3. As seen in FIG. 3, each Tag RAM has an incoming address bus 14ba. An incoming write enable signal (wen) is provided from the Fill Mask Logic 33. The Tag RAM has an output signal MATCHn designated 19 mn to represent the "hit" signal from the set n (0,1,2,3) when a match occurs. The output signals on line 37 from the enable switch state flip-flops 24 are also shown in FIG. 2 indicating these lines as 19e0, 19e1, 19e2, and 19e3. Each Tag RAM set (0,1,2,3) can receive or transmit two particular "status bits" designated as the VBITn and the RBITn. The VBIT represents the valid bit which when V=1 indicates that the addressed data is valid. The "R" bit is a second status bit which indicates whether or not the address and data in this particular cache memory are also present in another cache memory in the system. In FIG. 3, the bus which transfers the status bits is designated 29s, which is a 2-bit bus. The 16-bit bus 29d is the bus which is used to set up the address to the data RAMs 19d. Bus 29d carries input and output values of Tag RAM 19t. The Cache Control Logic 16 can also detect parity errors via bus 29d.

The 16 bits on bus 29d plus the 2 bits on bus 29s represent 18 signal bits which indicates what is actually written into or read out of an individual address location in TAG RAM 19t. By using these 18 bits, the TAG RAM 19t will do a comparison to see if the incoming address on bus 14ba will find a match to detect a "hit" condition or, if no match, to signal a "miss" condition.

The integrity of the information stored within the TAG RAM 19t of FIG. 3 is vital to proper system operation when a cache memory is used. In order to insure the integrity of addresses in RAM 19t, parity information data is maintained on these signals. This system uses the odd byte parity on each of the two 8-bit bytes in the TAGn field on bus 29d. Additionally, parity is maintained on the two status bits on bus 29s. Thus, there are three parity values maintained for each one of the four cache sets. These parity values can be stored in a separate RAM device which is not shown in the figures and is not necessary for the implementation of the present system.

Since there are three separate parity values maintained for each one of the four cache sets, there are then three possible parity errors related to the parity checking that can occur for each one of the cache sets. If any parity error condition should occur on any one set of the cache TAG RAMs 19t, then a cache "miss" condition would be indicated, but the system will never indicate a "hit" if there is a parity error. Further, the cache parity error conditions are conveyed over to the enable switch state unit 24 for setting up the proper cache degradation actions. The possible cache errors that may occur are presented in the Table I shown below.

TABLE I

| | |
|---|---|
| $U_{13}$ PERRn | TAGn Upper Byte Parity Error |
| $L_{13}$ PERRn | TAGn Lower Byte Parity Error |
| $S_{13}$ PERRn | Status Bits Parity Error |

(n = 0,1,2,3)

Since the data on the TAG 16-bit bus designated 29d is composed of two, 8-bit bytes, and one of these is designated as the upper byte "U", and one of these is designated as the lower byte "L", then Table I indicates the possibility of a parity error on the upper byte, on the lower byte or on the status bits of an address word residing in a Tag RAM set of 19t.

Cache Multiple-Hit Error

Figure 6:
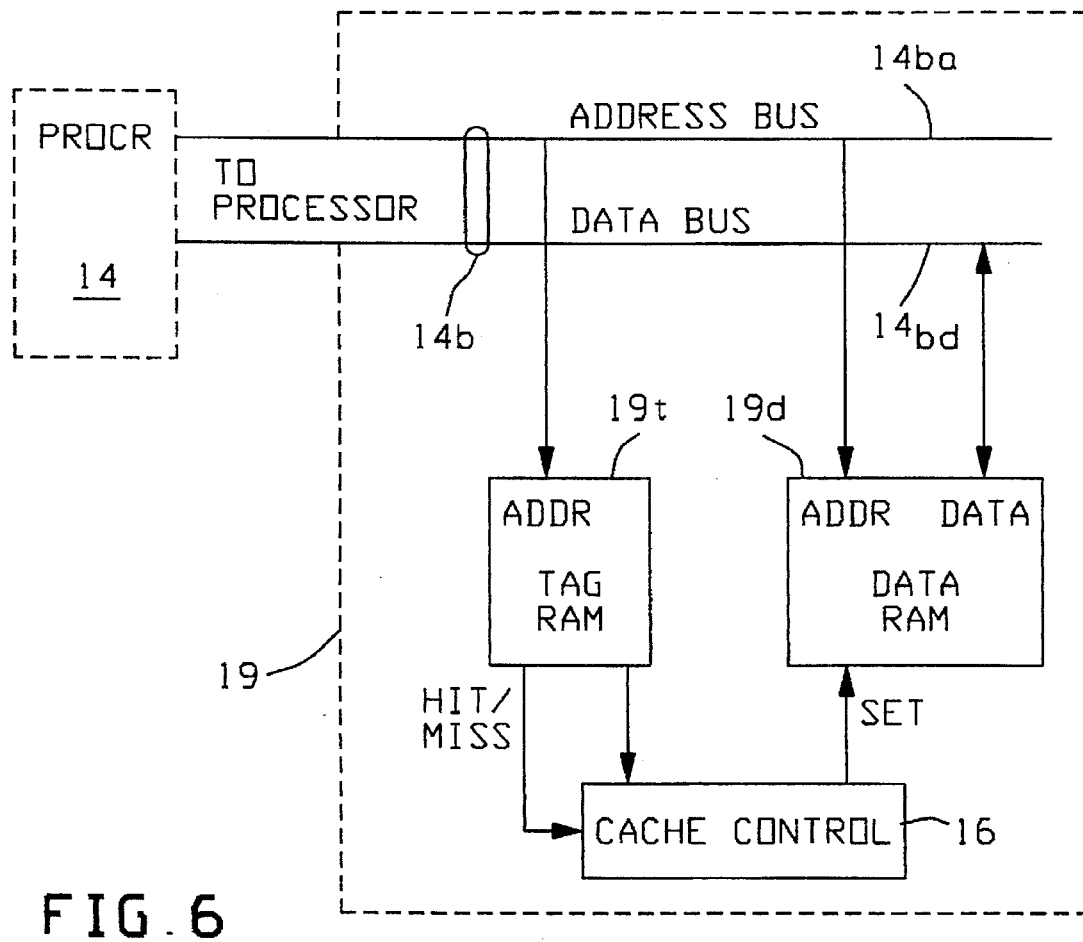
FIG. 6 a diagram of the units in cache memory connected, via the internal processor bus, to the processor.
Figure 4B:
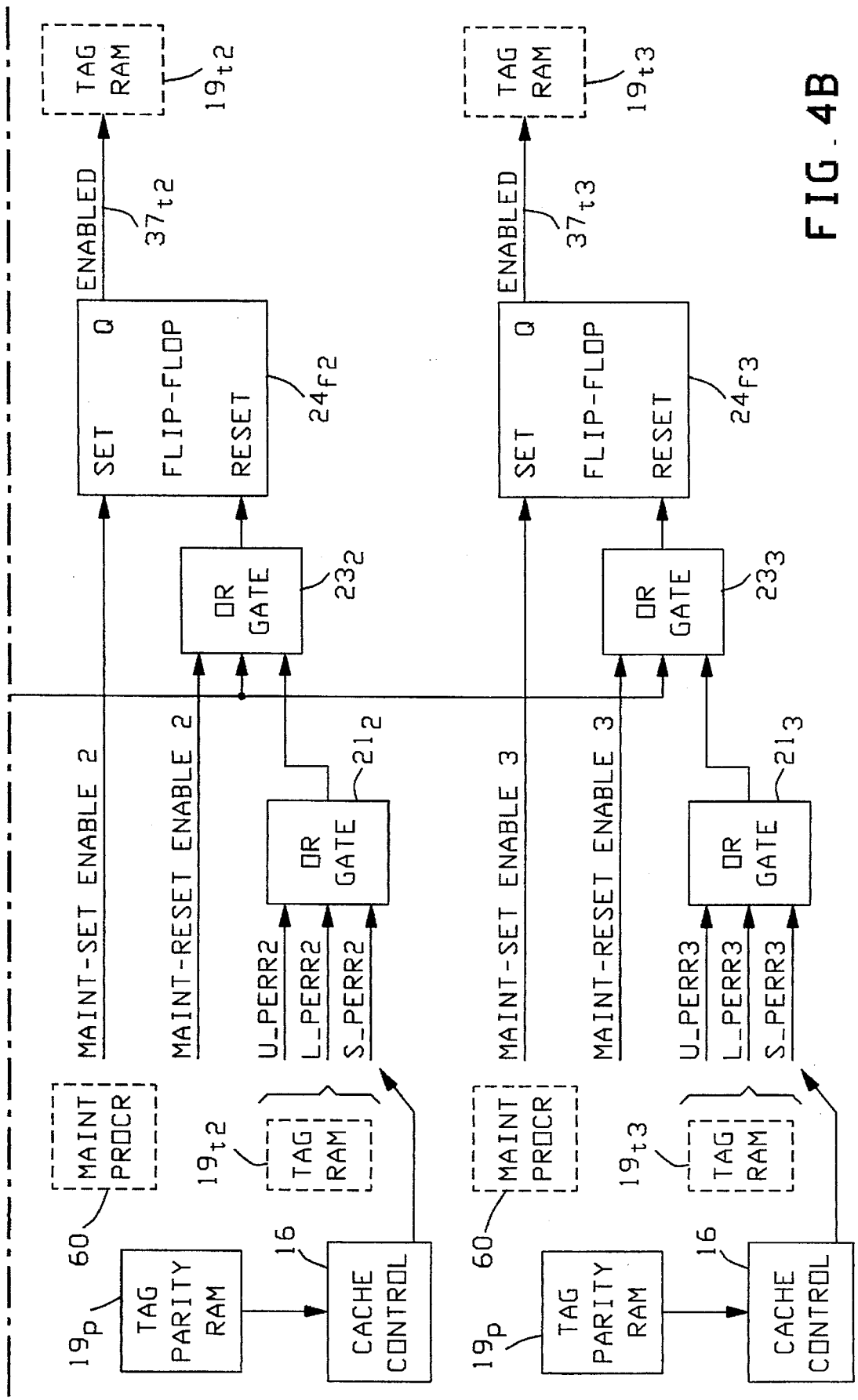

FIG. 3 indicates the output MATCHn signal, 19 mn, out of each one of the four cache sets. This signal line indicates that the respective cache TAG RAM 19t has detected a "hit" condition for the incoming address value on input bus 14ba. The cache control logic 16 (FIGS. 3, 6) then uses the four "MATCH" signals to derive the overall cache "hit" or the cache "miss" condition. Since there are four such match signals on line 19 mn, that is, one from each of the four cache sets, there is a possible "unknown" condition which may occur. This condition is the possibility of there being more than a single one match indicator signal responding to a given memory address on the address bus 14ba. This could be called a "multiple hit": signal. For a properly operating cache memory system, this should never occur. It indicates that either the cache fill logic has failed and has written data into more than a single set location for a given address value, or that one or more of the cache TAG RAMs 19t has failed and is erroneously indicating a false "match" condition. Whatever the cause, this type of "multiple-hit" situation is untenable for proper operation of the system. Further, there is no way to know where exactly to readout the data and from which of the two cache set locations having the same address. The question arises: which of the indicating sets (having a match signal) really has the valid memory data information. This type of situation involves a serious question as to the general integrity of the cache memory, its TAG RAMs, its fill logic and its hit logic. Thus, any confidence in the cache memory as a good source of data for the processor is no longer viable. The situation of a multiple-hit, that is to say, a multiple match condition in this system is always treated as a cache "miss" and never as a "hit." Further, this type of error condition is transferred over to the enable switch 24 for proper cache degradation actions. The multiple cache error signal for this type of cache error situation is designated in the Table II hereinbelow.

TABLE II

| MHERR | Multiple-Hit Cache Error |
|---|---|

The Cache Control Logic 16 of FIG. 3 is the source of the signals SPERRn UPERRn and LPERRn. A Parity RAM 19$p$ provides parity bits to the Cache Control Logic 16.

Figure 4:
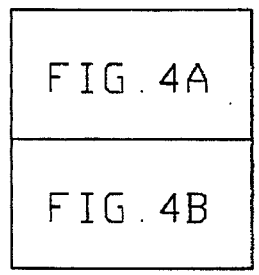
FIG. 4 is a drawing of the four "enable" switch flip-flops used to control the individual cache sets in the cache Tag RAM.
Figure 5:
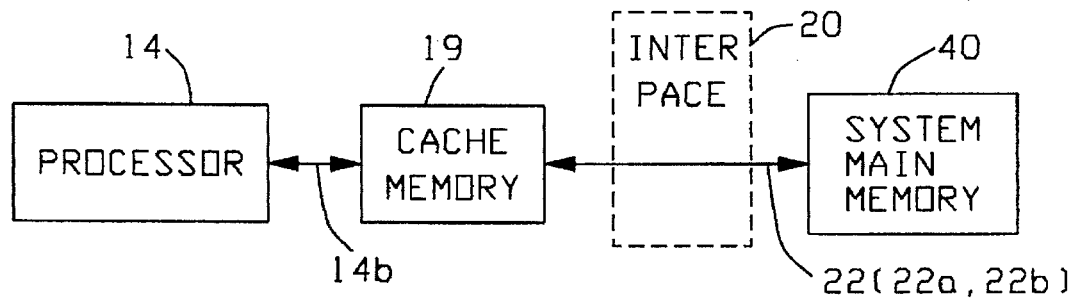
FIG. 5 is a general view of a processor system with cache memory and access to main system memory.

The enable switch state flip-flop unit 24 shown in FIG. 1 is now seen in more detail in FIG. 4. Here, there are provided four flip-flops 24$f$0, 24$f$1, 24$f$2, and 24$f$3, each of which provides the enable signals 0, 1, 2, 3, designated in FIG. 1 as t0, t1, t2, and t3. Each flip-flop is provided with a "set" enable input from each of the maintenance set lines from the Maintenance Subsystem 60. The Maintenance Subsystem 60 also provides a maintenance "reset" enable signal in each case, which is fed to an OR gate 23 (respectively 23$_0$, 23$_1$, 23$_2$, and 23$_3$) ).

The multiple-hit error signal (MHERR) is fed to each OR gate 23 in FIG. 4, that is, to 23$_0$, 23$_1$, 23$_2$, 23$_3$. Further, each flip-flop set has an OR gate 21 (21$_0$, 21$_1$, 21$_2$, 21$_3$) which receives the parity error signals designated as the upper byte parity error signal (UPERRn), the lower byte parity error signal (LPERRn), and the status bits parity error signal (SPERRn). The OR gate 21$n$ then connects its output to OR gate 23$n$ which feeds the reset input to each of the flip-flops 24$fn$ of FIG. 4.

Automatic Adjustment Feature for Enable Switch Unit 24

FIG. 4 shows a diagram of the four enable switch flip-flops 24$f$0, 24$f$1, 24$f$2, and 24$f$3 which generate the signals 37$_0$, 37$_1$, 37$_2$, and 37$_3$ which signals are fed to the cache TAG RAMs respectively 19$t$0, 19$t$1, 19$t$2 and 19$t$3 of FIG. 1. In this type of multi-cache system, it is permissible for the flip-flops to be placed in any combination of the 4 switches which would result in 16 different possible states among the four flip-flop switches. There is one particular "set" condition which exists for each one of the flip-flops 24$f$, while at the same time there are several possible "reset" conditions for each one of the flip-flops 24$f$.

Only the Maintenance Subsystem 60 can set the flip-flops 24$f$ to their active (enable) state condition. This is done at system initialization time whereby any combination of switching arrangement is permissible. However, it may be noted that the Maintenance Subsystem 60 is also capable of setting the several "reset" conditions that are possible.

In FIG. 4, each of the enable switch flip-flops 24$f$, has three "reset" case source conditions, namely (a) the maintenance subsystem 60, (b) the cache multiple-hit error condition, or (c) the cache TAG RAM parity error conditions. The latter one of these, that is to say, the TAG RAM parity error further has three possibilities of its own, namely (i) the upper byte parity error, (ii) the lower byte parity error, and (iii) the status bits parity error.

It is of importance to note that the cache TAG RAM parity error conditions are unique to each one of the four sets. Thus, there are physically 12 such parity error signals, which means there are three parity error signals for each one of the four sets. The TAG RAM parity error conditions only "turn-off" their own "set enable" flip-flop. They do not reset any other enable flip-flop. For example, an Upper Byte Parity Error for Set 2 (UPERR2) will reset the Enable 2 flip-flop only (24$f$2). Also, a Status Bit Parity Error for Set 3 will reset the Enable 3 flip-flop only (24$f$3).

This selective feature allows parity errors to be "isolated" to their own particular TAG RAM set and its associated parity bits and parity checking circuitry. Therefore, the various parity error conditions, of which there are 12 in all, will cause the cache memory to degrade only to the degree of the error actually detected. Thus, the set having the parity error, will immediately be disabled and taken off-line. All other cache sets will continue to operate as if no problem had occurred. In this situation, the cache memory will operate as a somewhat smaller cache, possibly reduced by one-fourth in size, but will still manage to get a high "hit" rate for the processor 14. Of course, all the data that is currently held in the TAG set taken off-line, is no longer available to the processor. All of these addresses (formerly in the off-line set) will now be retrieved from the main system memory 40.

Now, when the processor 14 requests an address and data from an "off-line" cache set, there will be a "miss" signal and the data will be retrieved from main memory 40 and then will be written (filled) into the presently existing "on-line" cache sets where they will be available for future hits to the processor. Another important factor to realize is that the Multiple-Hit Error signal is common to all four of the cache sets. Thus, if a Multiple-Hit Error occurs, all four of the cache sets are turned "off-line," and disabled. This also is an important feature, since this type of error would create great doubt about the integrity of the cache data. This could create a catastrophic error for the cache since then it becomes totally disabled. However, the operation of the system itself is undisturbed. It continues to operate however degraded in performance since now all memory request operations must now go to the main system memory 40. But, this continuous operation is of significant value to the customer or the user who can continue to get work done even when some of his cache hardware is inoperative.

As cache error conditions occur, they are flagged to the Maintenance Subsystem 60 for attention. The Maintenance Subsystem 60 can discern the nature and extent of the cache degradation from the type of error which was indicated, that is to say, a parity error or a multiple-hit error, and also from reading the enable switch flip-flop state unit 24 which will indicate which cache sets are still operating in the "on-line" condition. Thus, the cache memory may operate with fewer "on-line" sets or with none of the sets but still this does not cause the processor 14 to miss its continuous operational processing in getting the real work of the system done.

Described therein has been a system which provides the capability for a multiple set structured cache memory to operate in either a full configuration with all of its cache sets operating, or else operating in some reduced degraded configuration where not all of the cache sets are on-line. The system provides both for the intentional control of the configuration at system initialization time as well as automatic adjustment of the configuration when certain error conditions occur so that only selected cache sets having problem areas are removed (disabled). This automatic adjustment of the usable conditions of each set of the cache memory occurs without any stoppage or disturbance to the processor, allowing the cache to continue to operate in a somewhat degraded or completely degraded mode, but system operations will continue to be executed.

While one embodiment of the present system has been disclosed, it should be understood that other configurations may still be operable which still implement the concept of the invention as defined in the following claims.

What is claimed is:

1. A network having a cache system supporting a processor and connected to main memory and having multiple sets of tag and data RAMs which are concurrently adjustable by an associated maintenance subsystem means, to on-going operating conditions, by selecting which ones of said multiple sets of tag RAMs will be on-line and which off-line, comprising:

(a) N sets of tag RAMs for holding tag addresses of cache data words residing in each one of N associated sets of data RAMs each one of said addresses involving an upper byte and a lower byte;

(b) N sets of parity RAMs wherein each said set holds a parity bit for each upper by address and each lower byte address plus a status parity bit which indicates the parity of the combination of a valid bit (V) and a resource bit (R), said R bit indicating the presence of the same cache data word in another cache in the network;

(c) means to selectively place on-line or off-line each one of said N sets of tag RAMs, wherein said means to selectively place on-line or off-line includes:

(c1) switch unit means for receiving enable/disable signals from said maintenance subsystem means for determining which set of said N sets of tag RAMs will be on-line or off-line; wherein said switch unit means includes:

(i) means to detect a multiple-hit condition, signaled by said cache control means, which occurs on a single processor access request cycle to said N tag RAMs;

(ii) means to disable all N sets of said Tag RAMs when said multiple-hit condition is detected (c2) said maintenance subsystem means including:

(i) means to generate enable/disable signals to said switch unit means for each set of N sets of tag RAMs;

(ii) means to sense and indicate the on-line/off-line condition of each individual set of said tag RAMs;

(C3) cache control means for checking said upper parity bit, said lower parity bit and said status parity bit including:

(i) means to signal said switch unit means to place off-line any tag RAM set which indicates a parity error in said upper, lower or status parity bit (ii) means to detect a parity error in any said upper address, lower address or status bits in any one set of said tag RAMs when an address is requested by said processor.

2. The network of claim 1 wherein said cache control means further includes a cache fill logic means for selecting which one of said N sets of tag and data RAMs will be utilized to fill in data retrieved from main memory after a cache miss operation.

3. A method for optimal utilization of a cache memory having N sets of tag memories holding addresses of data words in N sets of data memories wherein each address has an upper byte and a lower byte without interference to operation of an associated processor, comprising the steps of:

(a) maintaining a parity RAM holding a parity bit for each upper address byte and each lower address byte;

(b) checking the parity bit of each said upper and lower address by during an address request to said N sets of tag memories;

c) generating a parity error signal to a switching state unit when the parity bit is not coincident;

d) setting, via said switching state Unit, that particular set of Tag memory, which indicated the address parity error, into an off-line condition;

e) detecting the occurrence of multiple address hits during one single processor access address request cycle;

(f) switching off-line each one of said N sets of said tag memories;

(g) selecting which one of said N sets of data memories will be filled with data words retrieved from main memory when an address miss occurs on a processor request cycle;

(h) initializing the N sets of Tag memories and data memories to be selectively on-line or off-line;

(i) monitoring the status of each set of said tag memories to indicate which ones are one-line and which ones are off-line.

* * * * *